United States Patent [19]

Matsuura et al.

[11] Patent Number: 4,621,064
[45] Date of Patent: Nov. 4, 1986

[54] LOW TEMPERATURE SEALING COMPOSITION WITH SYNTHETIC ZIRCON

[75] Inventors: Ichiro Matsuura; Fumio Yamaguchi, both of Shiga, Japan

[73] Assignee: Nippon Electric Glass Company, Limited, Otsu, Japan

[21] Appl. No.: 713,000

[22] Filed: Mar. 18, 1985

[30] Foreign Application Priority Data

Mar. 19, 1984 [JP] Japan .................................. 59-52822

[51] Int. Cl.⁴ ............................................. C03C 8/24
[52] U.S. Cl. ........................................ 501/15; 423/20; 423/84; 423/85; 423/608; 428/432; 501/17; 501/18
[58] Field of Search ............... 501/15, 18, 17; 23/296; 423/20, 71, 84, 85, 608; 428/432

[56] References Cited

U.S. PATENT DOCUMENTS

| | | | |
|---|---|---|---|
| 3,119,661 | 1/1964 | Stambaugh et al. | 423/84 |
| 3,963,505 | 6/1976 | Dumesnil et al. | 501/15 |
| 4,256,463 | 3/1981 | Carter | 23/296 |
| 4,268,485 | 5/1981 | Deneke et al. | 423/84 |
| 4,323,405 | 4/1982 | Uno et al. | 156/89 |
| 4,365,021 | 12/1982 | Pirooz | 501/15 |
| 4,405,722 | 9/1983 | Kokubu et al. | 501/15 |
| 4,421,947 | 12/1983 | Kyle | 501/15 |
| 4,524,001 | 6/1985 | Joubert | 423/85 |
| 4,528,212 | 7/1985 | Cairns et al. | 428/432 |
| 4,537,863 | 8/1985 | Matsuura et al. | 501/15 |

FOREIGN PATENT DOCUMENTS

| | | | |
|---|---|---|---|
| 2051299 | 4/1972 | Fed. Rep. of Germany | 423/608 |
| 48-16428 | 5/1973 | Japan | 423/608 |
| 55-10426 | 1/1980 | Japan | 501/18 |
| 56-49861 | of 1981 | Japan . | |
| 56-114364 | 9/1981 | Japan | 501/18 |

*Primary Examiner*—Helen M. McCarthy
*Attorney, Agent, or Firm*—Kurt Kelman

[57] ABSTRACT

A sealing composition suitable for sealing alumina packages for integrated circuits at a temperature below about 450° C. for a short time of about 10 minutes. The composition is a mixture of 50–80 wt % vitreous solder glass powder of $PbO-B_2O_3$ system having a deformation point of 350° C. or less, 1–35 wt % zinc material powder and 1–35 wt % zircon powder. The zircon powder is of a synthetic zircon artificially prepared to eliminate radioactive impurities such as uranium and/or thorium.

6 Claims, 2 Drawing Figures

LOW TEMPERATURE SEALING COMPOSITION WITH SYNTHETIC ZIRCON

BACKGROUND OF THE INVENTION

1. Field of the Invention

The present invention relates to sealing compositions and, in particular, to compositions for sealing alumina ceramic packages in which integrated circuits or other solid state devices are encapsulated.

A known sealing composition for sealing alumina ceramic packages comprises a mixture of vitreous solder glass powder, lead titanate powder, and zircon (zirconium silicate, $ZrSiO_4$) powder, as disclosed in Japanese Patent Publication No. 56-49861. This known sealing composition has good mechanical strength and resistance to thermal shock. However, it has a high dielectric constant and, therefore, is not good for sealing packages containing large-scaled integrated circuits such as memories. Further, the composition disadvantageously radiates $\alpha$-rays because zircon usually available includes radioactive impurities such as uranium and/or thorium therein whereby certain integrated circuits are damaged.

U.S. Pat. Nos. 4,405,722 and 4,421,947 disclose sealing compositions including zircon which is not desirable for the above-described reason.

U.S. Pat. No. 4,405,722 discloses a mixture of vitreous glass powder and cordierite powder including $\beta$-eucryptite, $\beta$-spodumen, zircon, and/or lead titanate as optional ingredients. The sealing composition, even if zircon is not used, is not high in mechanical strength, and has a tendency to suffer from micro-cracks caused by heat shock resulting in damage to the hermetical seal.

U.S. Pat. No. 4,421,947 discloses a sealing composition having crystalline filler other than zircon, but the sealing composition is not a powdery mixture and has a high sealing temperature of about 1225° F.

Another known sealing composition comprises a mixture of a $PbO-B_2O_3$ or $PbO-B_2O_3-ZnO$ solder glass powder and non-inert zinc zirconium silicate powder, as disclosed in U.S. Pat. No. 3,963,505. However, the sealing composition is not so desirable because zinc zirconium silicate included therein includes radioactive impurities such as uranium and/or thorium.

SUMMARY OF THE INVENTION

It is an object of the present invention to provide a low temperature sealing composition which has a low sealing temperature, high resistance to heat shock, high mechanical strength, and reduced dielectric constant, and which includes no radioactive substances.

According to the present invention, a low temperature sealing composition is provided, which comprises a powdery mixture of, by weight, 50-80% (more advantageously, 60-75%) vitreous solder $PbO-B_2O_3$ glass powder having a deformation point of 350° C. or less, 1-35% (more advantageously, 10-30%) inert zinc material powder, and 1-35% (more advantageously, 2-20%) synthetic zircon powder artificially prepared to exclude radioactive substances.

If the solder $PbO-B_2O_3$ glass used is devitrifiable, the sealing temperature is elevated so that the sealing composition is not able to seal at 450° C. or less. If the solder $PbO-B_2O_3$ glass is vitreous but has a deformation point higher than 350° C., the sealing temperature of the resultant composition is also elevated higher than 450° C. Therefore, the solder $PbO-B_2O_3$ glass used must be vitreous and have a deformation point of 350° C. or less.

If the amount of the vitreous solder glass is less than 50 wt%, the flowability of the composition is reduced so that sealing cannot be performed at a temperature of 450° C. or less. On the other hand, if the amount of the solder glass exceeds 80 wt%, the thermal expansion coefficient of the composition becomes too high so that resistance to heat shock is reduced.

Therefore, the amount of the vitreous solder glass of $PbO-B_2O_3$ system must be selected within a range of 50-80 wt%, more advantageously, 60-75 wt%.

The zinc material is used for lowering the expansion coefficient and the dielectric constant of the sealing composition. Use of more than 35 wt.% of the inert zinc material reduces flowability of the resultant sealing composition so that sealing cannot be performed at 450° C. or less. Including less than 1 wt% of the zinc material in the sealing composition cannot provide a sufficient hermetic seal. Therefore, the amount of the inert zinc material powder is determined to be 1-35 wt%, more advantageously, 10-30 wt%.

The zinc material means one including zinc oxide as the major ingredient.

The synthetic zircon is used for increasing the mechanical strength and the thermal conductivity of the sealing composition. The amount of the synthetic zircon powder is determined to be 1-35 wt% for a similar reason. More advantageously, it is 2-20 wt%.

The synthetic zircon powder is one artificially prepared to exclude radioactive substances such as uranium and/or thorium.

Further objects, features and other aspects of this invention will be understood from the following description of preferred embodiments referring to the accompanying drawings.

DETAILED DESCRIPTION OF PREFERRED EMBODIMENTS

Figure 1:
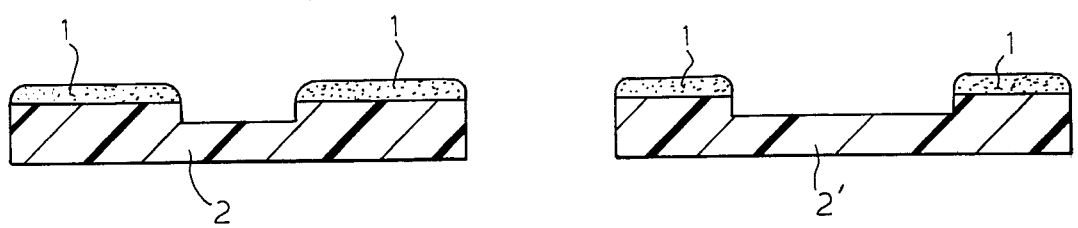
FIG. 1 is a sectional view of a pair of alumina ceramic parts for an alumina package, on which a paste of a sealing composition of this invention is printed.

A preferred composition of the vitreous solder $PbO-B_2O_3$ glass used in the present invention comprises 70-90 wt% (more advantageously, 83-87 wt%) PbO, 10-15 wt% (more advantageously, 10-13 wt%) $B_2O_3$, 0-10 wt% (more advantageously, 0.5-1.5 wt%) $SiO_2$, and 0-5 wt% (more advantageously, up to 3 wt%) ZnO. The vitreous solder glass can include $Al_2O_3$, $Bi_2O_3$, and $PbF_2$ with a total amount thereof being 5 wt% or less.

Two example glasses Nos. 1 and 2 as listed in Table I were produced by using red lead, boric acid, silica sand, aluminum hydroxide, lead fluoride, and zinc oxide as the materials for respective ingredients of the glasses. Those materials were weighed and mixed according to weight percent indicated in Table I. The batch for each of glasses Nos. 1 and 2 was melted at 900° C. for 30 minutes in a platinum crucible. The molten glass was quenched between counter rotating stainless steel rollers. The resultant glass flake was milled in an alumina ball mill and then was screened through 150 mesh screen of stainless steel.

TABLE I

|  | Glass 1 | Glass 2 |
| --- | --- | --- |
| PbO (wt %) | 84.8 | 84.3 |
| $B_2O_3$ (wt %) | 12.3 | 11.9 |
| $SiO_2$ (wt %) | 1.0 | 1.0 |
| ZnO (wt %) | 1.4 | 2.8 |
| $Al_2O_3$ (wt %) | 0.5 | — |
| Deformation | 327 | 325 |

A preferred zinc material used in this invention is a ceramic which comprises 68–75 wt% ZnO, 23–28 wt% $SiO_2$, and 0.1–8 wt% $Al_2O_3$.

An example of the zinc material powder is presented in Table II which was produced by using zinc oxide, silica sand, and alumina as its raw materials. Those raw materials were weighed and mixed. The batch was fired at 1440° C. for 15 hours. The resultant ceramic material was milled in an alumina ball mill and then was screened through 250 mesh stainless steel screen. The thermal expansion coefficient of the ceramic obtained was $15 \times 10^{-7}/°C$.

TABLE II

| ZnO | $SiO_2$ | $Al_2O_3$ |
| --- | --- | --- |
| 70.6 (wt %) | 24.7 (wt %) | 4.7 (wt %) |

For use in the present invention, a synthetic zircon was produced from natural zircon and silica sand by the following steps.

Zircon sand was subjected to alkali fusion to obtain sodium zirconate. The natrium zirconate was dissolved in hydrochloric acid aqueous solution to form zirconium hydrochloric acid solution. The solution was subjected to several recrystallization treatments to eliminate radioactive impurities and to obtain zirconium oxychloride. The zirconium oxychloride was treated by sodium hydroxide to form zirconium hydroxide. The zirconium hydroxide was baked and zirconium oxide was obtained. The zirconium oxide was mixed with silica sand at a molecular ratio of 1:1, and then baked at 1200° C. using a fusing agent. Thus, the synthetic zircon was obtained, which included almost no radioactive impurities such as uranium and/or thorium which were included in the natural zircon.

The synthetic zircon has a thermal expansion coefficient of $50 \times 10^{-7}/°C$.

Each glass powder of glasses Nos. 1 and 2 in Table I, the example of the zinc material powder in Table II, and the synthetic zircon powder screened through 250 mesh stainless steel screen were weighed and mixed with one another according to weight percent listed in Table III.

Each mixture of Nos. 1–7 in Table III was mixed with a suitable vehicle to form a paste. An example of the vehicle used is α-terpineol solution of 5% acrylic resin. Each paste was used for sealing a package for integrated circuits, according to a conventional sealing method. A sealing method is exemplarily described below.

TABLE III

|  | Exp. 1 | Exp. 2 | Exp. 3 | Exp. 4 | Exp. 5 | Exp. 6 | Exp. 7 |
| --- | --- | --- | --- | --- | --- | --- | --- |
| Glass 1 (wt %) | 65.8 | 66.3 | 64.8 | 68.0 | — | — | — |
| Glass 2 (wt %) | — | — | — | — | 66.0 | 68.0 | 63.0 |
| Zinc material (wt %) | 17.8 | 26.0 | 7.0 | 29 | 2.0 | 30.0 | 27.0 |
| Synthetic zircon (wt %) | 16.4 | 7.7 | 28.2 | 3 | 32.0 | 2.0 | 10.0 |
| Thermal expansion constant ($\times 10^{-7}/°C$.) | 66.9 | 66.4 | 70.1 | 65.0 | 72.0 | 64.1 | 65.5 |
| Sealing temp. (°C.) | 450 | 430 | 450 | 430 | 440 | 435 | 440 |
| Sealing time (minutes) | 10 | 10 | 10 | 10 | 10 | 10 | 10 |
| Shearing strength of sealed package (Kg) | 340 | 320 | 390 | 300 | 410 | 310 | 330 |
| Resistance to heat shock | 0/20 | 0/20 | 0/20 | 0/20 | 0/20 | 0/20 | 0/20 |
| Dielectric constant (1 MHz) | 12.1 | 12.0 | 12.5 | 12.2 | 12.7 | 12.0 | 12.0 |

Figure 2:
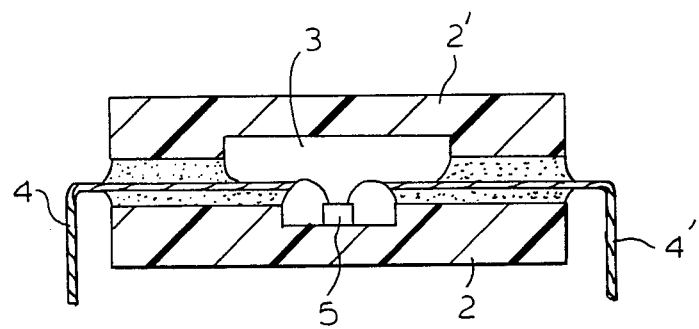
FIG. 2 is a sectional view of an I.C. package sealed by the use of the sealing composition of this invention.

The paste is printed onto respective sealing surfaces of alumina ceramic base 2 and cap 2' to form thin layers 1 of the paste of 0.3 mm thickness as shown in FIG. 1. The alumina ceramic parts 2 and 2' are then heated to about 390° C. at a rate of 5° C./min. and kept at that temperature for 1 minute to vapourize the vehicle in the paste so that a sealant layer (as shown at 1 in FIG. 1) is formed and fixed onto the sealing surface of each ceramic part 2 and 2'. Then, an IC element 5 is mounted by the use of Au-alloy in a cavity portion 3 of alumina ceramic base 2. Thereafter, alumina ceramic base 2 is put on a hot-plate heated at about 450° C. to soften the sealant 1 so as to fix leads 4 and 4' by the sealant softened. Leads 4 and 4' are bonded to IC element 5. Thereafter, alumina ceramic cap 2' is superposed onto the base 2 to cover the IC element 5. Then, the superposed base and cap are inserted into an electric furnace, and heated to 440° C. at a rate of 50° C./minute, and then held at the temperature for 10 minutes to seal the alumina package, as shown in FIG. 2.

The resistance to heat shock of the resultant package and the shearing strength along the longer side of the package were examined.

Heat shock test was performed according to the MIL-STD-883B; Method 1011.2; Condition C, that is, the sealed package was subjected to 15 cycles of thermal elevation and drop between 150° C. and −65° C. and the damage of hermeticity (or leak) of the package was examined.

In Table III, the shearing strength and the resistance to heat shock are presented. In Table III, the resistance to heat shock is given by a ratio of number of samples damaged by the heat shock test to the number of all samples tested. None of 20 packages sealed by using each sealing composition of the examples Nos. 1–7 was damaged after the heat shock test. It will be noted from the test data that the sealing compositions according to this invention are excellent in mechanical strength and resistance to heat shock.

In Table III, the expansion coefficient, deformation point and dielectric constant at 1 MHz of each example sealing composition of Nos. 1–7 are also presented. It will be also noted from the data that the sealing compositions according to this invention are suitable for sealing alumina packages.

According to the present invention, a sealing composition is provided which is low in sealing temperature and dielectric constant, short in time required for sealing, high in mechanical strength and resistance to heat shock, and radiates no α-rays.

What is claimed is:

1. A low temperature sealing composition which radiates no α-rays, consisting of a powdery mixture of 50–80 wt% glass powder, said glass being vitreous $PbO-B_2O_3$ solder glass containing substantially no radioactive substances and having a deformation point of 350° C. or less, 1–35 wt% inert zinc material powder, said zinc material consisting of ZnO, $SiO_2$ and $Al_2O_3$, and 1–35 wt% synthetic zircon artificially prepared substantially to exclude radioactive substances present in natural zircon.

2. A low temperature sealing composition as claimed in claim 1, wherein said powdery mixture consists of 60–75 wt % of the vitreous solder glass powder, 10–30 wt% of said inert zinc material powder, and 2–20 wt% of said synthetic zircon.

3. A low temperature sealing composition as claimed in claim 1, wherein said vitreous solder glass powder consists essentially of by weight, 70–90% PbO, 10–15% $B_2O_3$, 0–10% $SiO_2$, and 0–5% ZnO.

4. A low temperature sealing composition as claimed in claim 1, wherein said vitreous solder glass powder consists essentially of, by weight, 83–87% PbO, 10–13% $B_2O_3$, 0.5–1.5% $SiO_2$, and 0–3% ZnO.

5. A low temperature sealing composition as claimed in claim 1, wherein said inert zinc material powder consists of, by weight, 68–75% ZnO, 23–28% $SiO_2$, and 0.1–8% $Al_2O_3$.

6. A low temperature sealing composition as claimed in claim 1, wherein said synthetic zircon is a chemical compound produced by treating zircon sand by alkali fusion to make sodium zirconate, dissolving said sodium zirconate in hydrochloric acid aqueous solution to make zirconium hydrochloric acid solution, subjecting said solution to recrystallization to obtain zirconium oxychloride, treating said zirconium oxychloride with sodium hydroxide to form zirconium hydroxide, baking said zirconium hydroxide to form zirconium oxide, mixing said zirconium oxide with silica sand, and baking said mixture of said zirconium oxide and said silica sand at 1200° C. using a fusing agent to form the synthetic zircon.

* * * * *